United States Patent
Park

(10) Patent No.: US 7,999,372 B2
(45) Date of Patent: Aug. 16, 2011

(54) ORGANIC LIGHT EMITTING DISPLAY DEVICE AND METHOD OF FABRICATING THE SAME

(75) Inventor: Jin-Woo Park, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 729 days.

(21) Appl. No.: 11/529,884

(22) Filed: Sep. 29, 2006

(65) Prior Publication Data
US 2007/0170849 A1    Jul. 26, 2007

(30) Foreign Application Priority Data

Jan. 25, 2006  (KR) .......................... 10-2006-0007961
Apr. 18, 2006  (KR) .......................... 10-2006-0034899

(51) Int. Cl.
*H01L 23/10* (2006.01)

(52) U.S. Cl. ............ 257/707; 257/79; 257/98; 257/796; 257/E33.075

(58) Field of Classification Search .................... 257/98, 257/100, 79, 625, 707, 796
See application file for complete search history.

(56) References Cited

U.S. PATENT DOCUMENTS

| | | | |
|---|---|---|---|
| 4,238,704 A | 12/1980 | Bonk et al. | |
| 5,882,761 A | 3/1999 | Kawami et al. | |
| 6,226,890 B1 | 5/2001 | Boroson et al. | |
| 6,437,769 B1 | 8/2002 | Kobayashi et al. | |
| 6,538,375 B1 | 3/2003 | Duggal et al. | |
| 6,555,025 B1 | 4/2003 | Krupetsky et al. | |
| 6,570,325 B2 | 5/2003 | Graff et al. | |
| 6,580,223 B2 | 6/2003 | Konishi et al. | |
| 6,612,888 B1 | 9/2003 | Pai et al. | |
| 6,686,063 B2 | 2/2004 | Kobayashi | |
| 6,723,192 B2 | 4/2004 | Nagano et al. | |
| 6,750,606 B2 | 6/2004 | Kenmotsu | |
| 6,833,668 B1 | 12/2004 | Yamada et al. | |
| 6,853,126 B2 | 2/2005 | Nomura | |
| 6,992,330 B2 | 1/2006 | Fery et al. | |

(Continued)

FOREIGN PATENT DOCUMENTS

CN    1311976    9/2001

(Continued)

OTHER PUBLICATIONS

Office Action issued on Sep. 19, 2008 in corresponding Chinese Patent Application No. 200710008209.2 with its English translation in 10 pages.

*Primary Examiner* — Wai-Sing Louie
(74) *Attorney, Agent, or Firm* — Knobbe Martens Olson & Bear LLP

(57) ABSTRACT

Provided is an organic light emitting display device. An organic light emitting display device according to one embodiment of the present invention comprises a first substrate; a second substrate comprising an interior surface opposing the first substrate; an array of organic light emitting pixels formed between the first and second substrates, the array comprising a top surface facing the second substrate; a frit seal interposed between the first and second substrates while surrounding the array; and a film structure comprising one or more layered films, the film structure comprising a portion interposed between the array and the second substrate, the film structure contacting the interior surface and the top surface; and wherein the second substrate comprises a recess on interior surface.

26 Claims, 7 Drawing Sheets

U.S. PATENT DOCUMENTS

| | | | |
|---|---|---|---|
| 6,998,776 B2 | 2/2006 | Aitken et al. | |
| 7,042,546 B2 | 5/2006 | Tamashiro et al. | |
| 7,063,902 B2 | 6/2006 | Kikuchi et al. | |
| 7,285,340 B2 | 10/2007 | Lee et al. | |
| 2002/0193035 A1 | 12/2002 | Wei et al. | |
| 2003/0066311 A1 | 4/2003 | Li et al. | |
| 2003/0076039 A1 | 4/2003 | Ookawa et al. | |
| 2003/0218422 A1 | 11/2003 | Park et al. | |
| 2004/0046184 A1 | 3/2004 | Yanagawa et al. | |
| 2004/0051452 A1 | 3/2004 | Tamashiro et al. | |
| 2004/0069017 A1 | 4/2004 | Li et al. | |
| 2004/0150332 A1 | 8/2004 | Hwang et al. | |
| 2004/0191566 A1 | 9/2004 | Kikuchi et al. | |
| 2004/0201347 A1 | 10/2004 | Park et al. | |
| 2004/0207314 A1 | 10/2004 | Aitken et al. | |
| 2005/0179368 A1 | 8/2005 | Ryu et al. | |
| 2005/0233885 A1 | 10/2005 | Yoshida et al. | |
| 2005/0248270 A1 | 11/2005 | Ghosh et al. | |
| 2005/0264189 A1 | 12/2005 | Choi et al. | |
| 2005/0275342 A1 | 12/2005 | Yanagawa | |
| 2005/0285518 A1* | 12/2005 | Cok | 313/512 |
| 2006/0001041 A1* | 1/2006 | Peng | 257/103 |
| 2006/0082298 A1* | 4/2006 | Becken et al. | 313/512 |
| 2007/0013292 A1 | 1/2007 | Inoue et al. | |
| 2007/0090759 A1 | 4/2007 | Choi et al. | |
| 2007/0152212 A1 | 7/2007 | Cho et al. | |
| 2008/0048556 A1 | 2/2008 | Logunov et al. | |
| 2009/0221109 A1 | 9/2009 | Choi et al. | |

FOREIGN PATENT DOCUMENTS

| | | |
|---|---|---|
| CN | 1485929 A | 3/2004 |
| CN | 1536938 | 10/2004 |
| JP | 09-050250 A | 2/1997 |
| JP | 09-134781 A | 5/1997 |
| JP | 09-148066 | 6/1997 |
| JP | 09-278483 | 10/1997 |
| JP | 10-074583 | 3/1998 |
| JP | 10-125463 | 5/1998 |
| JP | 11-329717 A | 11/1999 |
| JP | 2000-100561 A | 4/2000 |
| JP | 2000-133847 | 5/2000 |
| JP | 2001-126866 | 2/2001 |
| JP | 2001-237066 | 8/2001 |
| JP | 2002-008853 | 1/2002 |
| JP | 2003-109750 A | 4/2003 |
| JP | 2003-123966 | 4/2003 |
| JP | 2003-197056 | 7/2003 |
| JP | 2004-265615 | 9/2004 |
| JP | 2004-347822 | 12/2004 |
| JP | 2005-026186 | 1/2005 |
| JP | 2005-139461 | 6/2005 |
| JP | 2006-524419 | 10/2006 |
| JP | 2008-513206 | 5/2008 |
| JP | 2008-518399 | 5/2008 |
| KR | 10-2003-0096517 A | 12/2003 |
| KR | 10-2004-0001064 A | 1/2004 |
| KR | 10-2004-0034468 | 4/2004 |
| KR | 10-2004-0073695 A | 8/2004 |
| KR | 10-2005-0024592 A | 3/2005 |
| KR | 10-2005-0031659 A | 4/2005 |
| KR | 1006-85845 | 2/2007 |
| TW | 517356 | 1/2001 |
| TW | 480898 | 3/2002 |
| TW | 1233316 | 5/2005 |
| TW | 200519741 | 6/2005 |
| WO | WO 2004/095597 | 11/2004 |
| WO | WO 2004-112436 | 12/2004 |

* cited by examiner

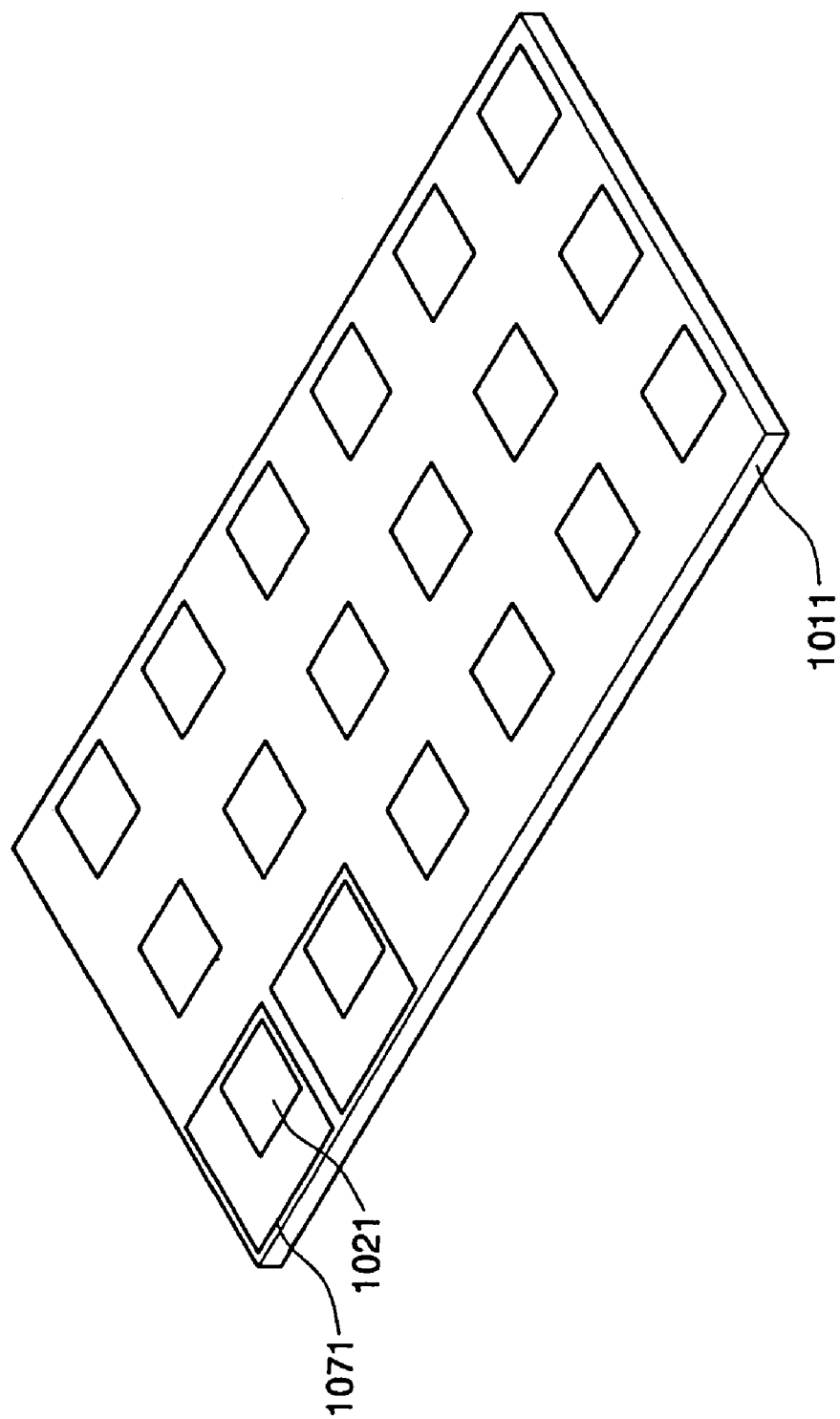

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2006-0007961, filed on Jan. 25, 2006 and No. 10-2006-0034899, filed on Apr. 18, 2006 the disclosure of which is incorporated herein by reference in their entirety. This application is related to and incorporates herein by reference the entire contents of the following concurrently filed application:

| Title | Filing Date | Application Ser. No. |
|---|---|---|
| ORGANIC LIGHT EMITTING DISPLAY AND METHOD OF FABRICATING THE SAME | May 29, 2007 | 11/754938 |

BACKGROUND

1. Field of the Invention

The present invention relates to a display device, and more particularly, to an organic light emitting display device.

2. Description of Related Art

Recently, attention has been focused on flat panel displays such as a liquid crystal display device, an organic light emitting display device, a plasma display panel (PDP), and so on. Since the liquid crystal display is a passive device rather than an emissive device, it is difficult to make it have high brightness and contrast, a wide viewing angle, and a large-sized screen. While the PDP is an emissive device, it is heavy, consumes much power, and requires a complex manufacturing process, compared to other displays.

Meanwhile, since the organic light emitting display device (OLED) is an emissive device, it has a wide viewing angle, and high contrast. In addition, since it does not require a backlight, it can be made lightweight, compact, and power efficient. Further, the OLED can be driven at a low DC voltage, has a rapid response speed, and is formed entirely of solid material. As a result, the OLED has the ability to withstand external impact and a wide range of temperatures, and can be fabricated by a simple method at low cost.

SUMMARY OF CERTAIN INVENTIVE ASPECTS

An aspect of the invention provides an organic light emitting display device, which may comprises: a first substrate; a second substrate comprising an interior surface opposing the first substrate; an array of organic light emitting pixels formed between the first and second substrates, the array comprising a top surface facing the second substrate; a frit seal interposed between the first and second substrates while surrounding the array; and a film structure comprising one or more layered films, the film structure comprising a portion interposed between the array and the second substrate, the film structure contacting the interior surface and the top surface; and wherein the second substrate comprises a recess on interior surface.

In the foregoing device, the film structure may not contact the frit seal. The interior surface may be substantially planar and has a size substantially equal to or greater than that of the top surface. At least part of the film structure may be formed within the recess. The film structure may extend into the recess. The film structure may further comprise another portion interposed between the first and second substrates while not interposed between the array and the second substrate. The film structure may cover substantially the entire portion of the top surface. The film structure may comprise a resin. The resin may be of a UV curable type or a heat curable type. The resin may comprise at least one selected from the group consisting of acrylic resins and polyimide resins. The resin may comprise a urethane acrylic resin. At least part of the film structure may be substantially transparent with respect to visible light. The array may emit visible light through the second substrate.

Still in the foregoing device, the recess may extend along a segment of the frit seal. The recess may be substantially parallel to the segment of the frit seal. The recess may form a closed loop. The interior surface may be substantially planar, and the recess may comprise a slope with reference to the interior surface such that the recess becomes deeper in a direction from the center of the interior surface toward periphery of the interior surface. The interior surface may be substantially planar, and the recess may comprise a first slope and a second slope with reference to the interior surface, which forms a valley, wherein the first slope may be closer to the center than the second slope, wherein the second slope may be steeper than the first slope with reference to the interior surface. The second slope may be substantially perpendicular to the interior surface. The array may comprise a first electrode, a second electrode and an organic light emitting material interposed between the first and second electrodes, wherein the first electrode may have a first distance from the first substrate, and the second electrode may have a second distance from the first substrate, wherein the second distance may be greater than the first distance, and wherein the top surface may be a surface of the electrode.

Further in the forgoing device, the film structure may comprise an organic layer and a protective layer interposed between the array and the organic resin layer, wherein the layer may be configured to substantially inhibit the organic resin layer from diffusing into the array. The recess may have a depth measured from the interior surface, and wherein the depth may be from about 20 μm to about 300 μm. The recess may have a width measured on the interior surface in a direction parallel to an edge of the interior surface, and wherein the width may be from about 0.1 mm to about 5 mm. The frit seal may comprise one or more materials selected from the group consisting of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate.

Another aspect of the invention provides a method of making an organic light emitting device, which may comprise: providing a first substrate and an array of light emitting pixels formed on the first substrate with or without a layer therebetween; providing a second substrate and a curable resin formed over a surface of the second substrate, the second substrate comprising a recess on the surface; arranging the first and second substrates such that the resin is located between the array and the second substrate; interconnecting the first and second substrates with a frit such that the frit surrounds the array; and curing a curable resin to form a film structure such that the film structure comprises one or more layered films comprising the cured resin and contacts the second substrate and the array. In the foregoing method, at least part of the resin may flow into the recess. The at least part of the resin may stop to flow within the recess.

BRIEF DESCRIPTION OF THE DRAWINGS

The above and other aspects and features of the present invention will be apparent from the following description of certain exemplary embodiments with reference to the attached drawings in which:

FIG. 6E is a schematic perspective view illustrating mass production of organic light emitting devices in accordance with one embodiment.

DETAILED DESCRIPTION OF EMBODIMENTS

Various embodiments of the present invention will now be described more fully hereinafter with reference to the accompanying drawings, in which exemplary embodiments of the invention are shown.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6A:
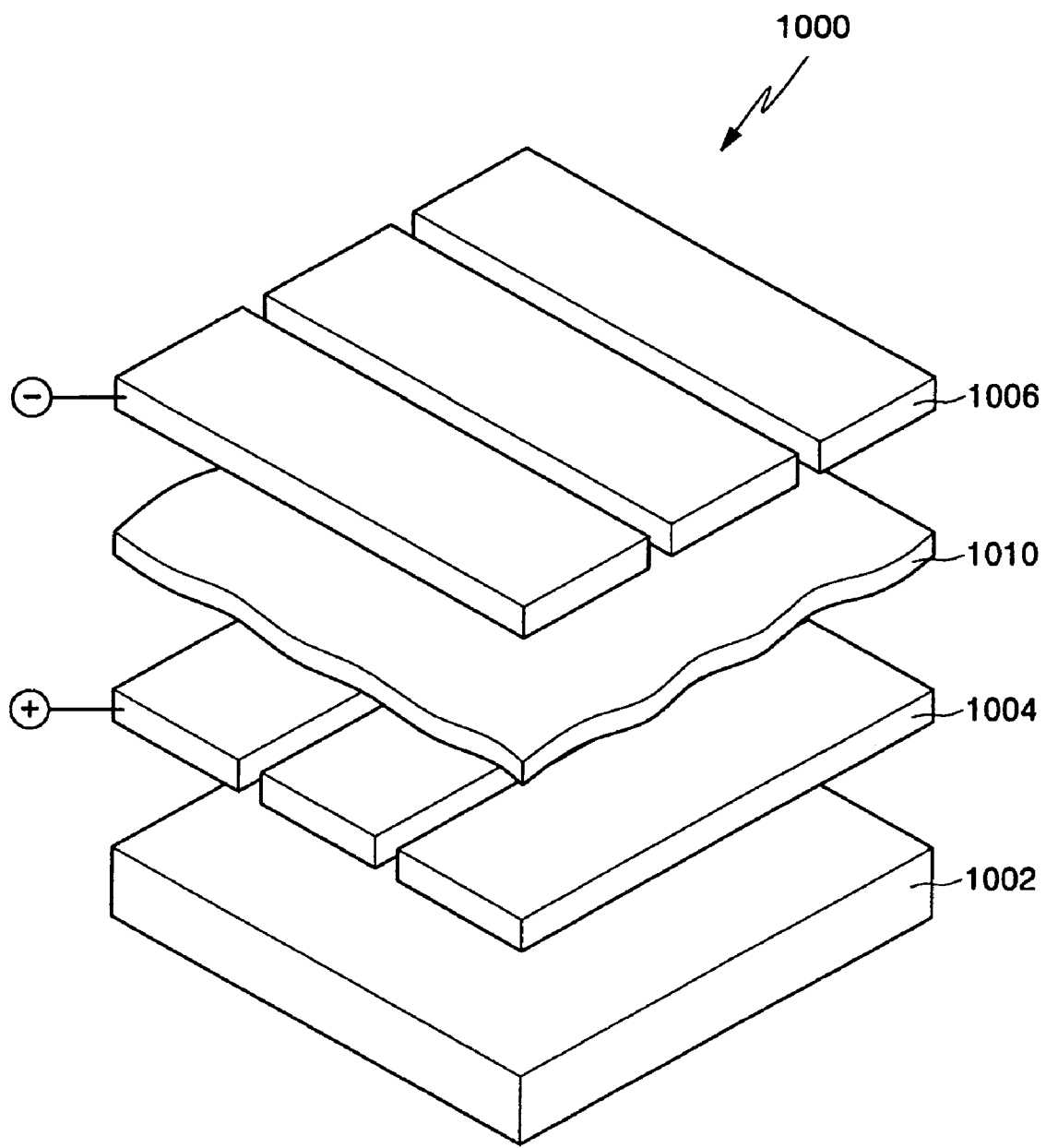
FIG. 6A is a schematic exploded view of a passive matrix type organic light emitting display device in accordance with one embodiment.
Figure 6B:
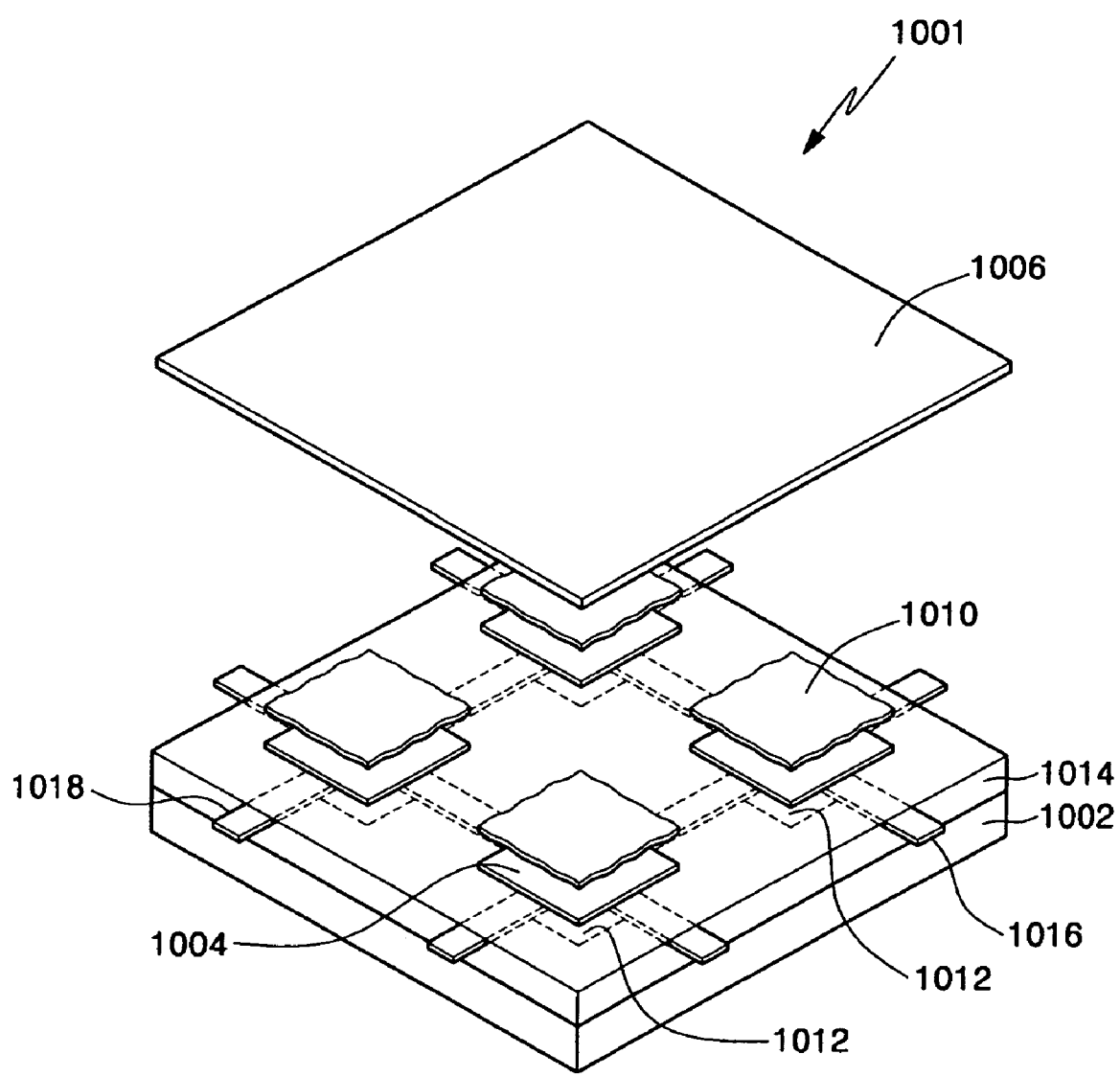
FIG. 6B is a schematic exploded view of an active matrix type organic light emitting display device in accordance with one embodiment.

OLEDs can be generally grouped into two basic types dependent on the arrangement with which the stimulating electrical current is provided. FIG. 6A schematically illustrates an exploded view of a simplified structure of a passive matrix type OLED 1000. FIG. 6B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 6B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is oppositely arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole. injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 6C:
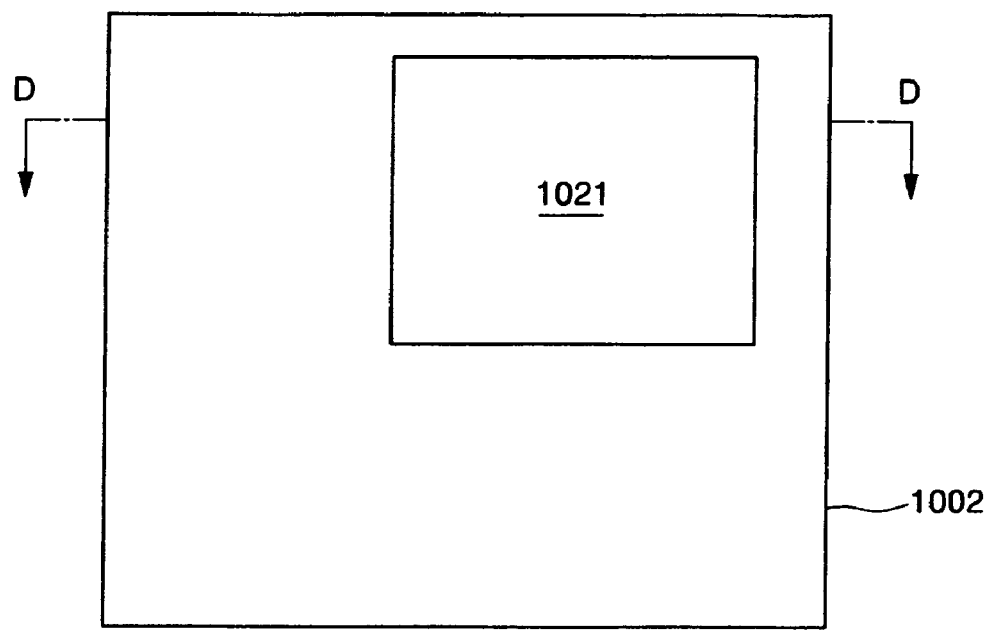
FIG. 6C is a schematic top plan view of an organic light emitting display in accordance with one embodiment.

In many embodiments, an OLED pixel array 1021 comprising a plurality of organic light emitting pixels is arranged over a substrate 1002 as shown in FIG. 6C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers. to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 6D:
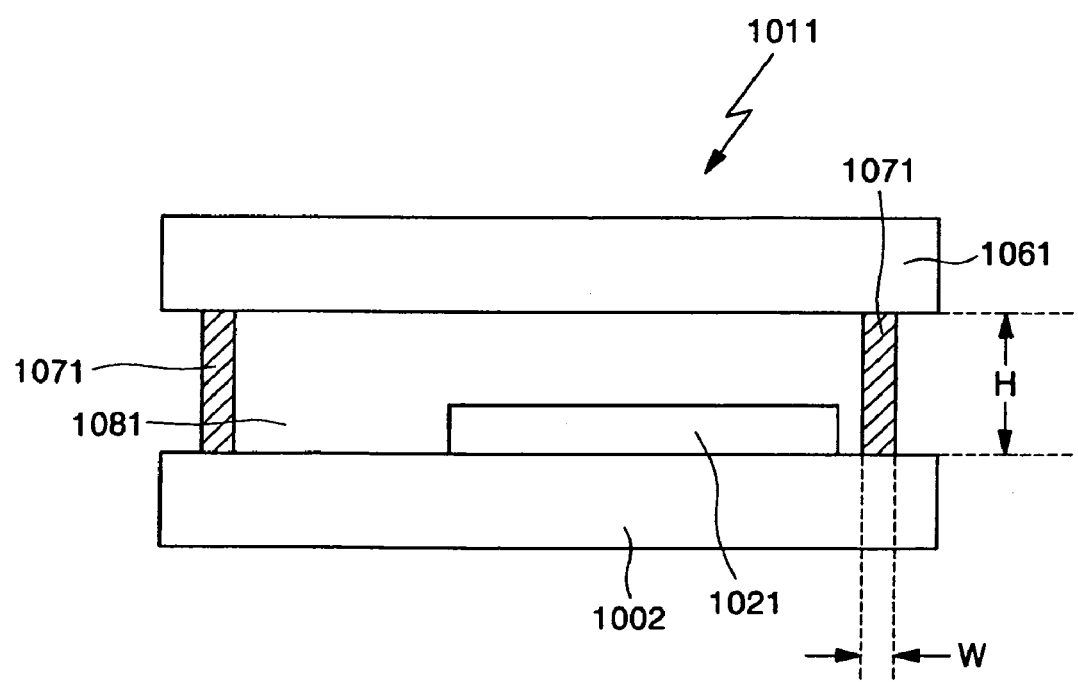
FIG. 6D is a cross-sectional view of the organic light emitting display of FIG. 6C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 6D schematically illustrates a cross-section of an encapsulated OLED device 1011 having a layout of FIG. 6C and taken along the line d-d of FIG. 6C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 6D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 6D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90 % inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

In some embodiments, OLED devices 1011 are mass produced. In an embodiment illustrated in FIG. 6E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 6D. In certain embodiments, the individual OLED devices 1011 then further undergo additional packaging operations to further improve the sealing formed by the frit seal 1071 and the top and bottom substrates 1061, 1002.

Figure 1:
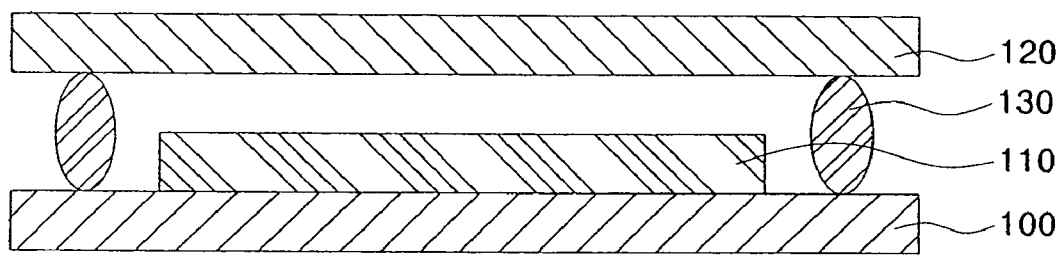
FIG. 1 is a cross-sectional view of an exemplary organic light emitting display device.

FIG. 1 is a cross-sectional view of an exemplary organic light emitting display device. Referring to FIG. 1, a substrate 100, which is equivalent to the bottom plate 1002, is provided, and organic light emitting diodes or pixels 110 is disposed on the substrate 100. The organic light emitting diode 110 includes a first electrode, an organic layer having at least an emission layer, and a second electrode. In addition, the organic light emitting diode 110 may further include a thin film transistor having a semiconductor layer, a gate electrode, and source and drain electrodes.

Subsequently, an encapsulation substrate 120, which is equivalent to the top plate 1061, is provided. A glass frit 130 is formed on one surface of the substrate 100 or the encapsulation substrate 120, and the substrate 100 is attached to the encapsulation substrate 120. Subsequently, a laser is irradiated on the glass frit 130 to melt and solidify the glass frit 130, thereby fabricating an organic light emitting display device. The glass frit is typically formed to have a height of about 14 µm or less. Thus, when the substrate and the encapsulation substrate are joined using the glass frit, a central portion of the encapsulation substrate may deform by about 7 to about 8 µm so that the encapsulation substrate has a curvature. As a result, an air gap between the substrate and the encapsulation substrate becomes irregular, and concentric circular patterns are formed on an emission surface of the encapsulation substrate, i.e., Newton's rings occur. Further, an internal space of the organic light emitting display device is typically filled with an inert gas such as $N_2$ or the like, and thus, the device may have less resistance against external impact.

To cope with the above-described drawbacks, the Newton's rings and the possible damage due to the external impact can be prevented by filling the internal space of the organic light emitting display device with a material or sealant such as urethane acryl or the like. However, such filling of the internal space may cause the material to contact the glass frit. Also, the material or sealant may contaminate the frit during the process of melting and resolidifying the frit for sealing between the substrate to the encapsulation substrate. For example, when laser is irradiated onto the glass frit for the sealing, the sealant as an organic material may be heated by the laser and turn to or generate chemical compounds that may be harmful to the glass frit. Also, such organic material may flow into the area where the glass frit is formed and form a film between the glass frit and the substrate so that adhesive strength between the glass frit and the substrate can be degraded.

Figure 2:
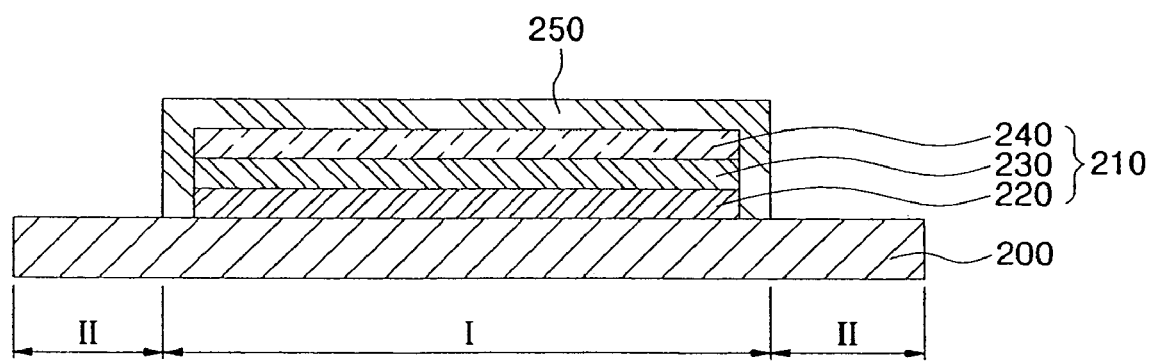
FIGS. 2 to 5 are cross-sectional views of an organic light emitting display device in accordance with exemplary embodiments. of the present invention.

FIGS. 2 to 5 are cross-sectional views of an organic light emitting display device in accordance with exemplary embodiments of the present invention. Referring to FIG. 2, a substrate 200, which is equivalent to the bottom plate 1002, having a pixel region I and a non-pixel region II is provided. An insulating glass, plastic, or conductive substrate may be used as the substrate 200.

In certain embodiments, an organic light emitting diode 210 is formed in the pixel region I of the substrate 200. The organic light emitting diode 210 includes a first electrode 220, an organic layer 230 having at least an emission layer, and a second electrode 240. In the organic light emitting diode 210, the first electrode 220 may be formed of Indium Tin Oxide (ITO) or Indium Zinc Oxide (IZO). Further, in a case of a top emitting type, the organic light emitting diode may further include a reflective layer. The organic layer 230 may include at least an emission layer, and may further include at least one of a hole injection layer, a hole transport layer, an electron transport layer, and an electron injection layer. The second electrode 240 may be formed of at least one of Mg, Ag, Al, Ca, and an alloy thereof which have a low work function. In addition, the organic light emitting diode 210 may further include a thin film transistor having a semiconductor layer, a gate electrode, and source and drain electrodes. The thin film transistor may be a top gate type in which the gate electrode is disposed above the semiconductor layer, or a bottom gate type in which the gate electrode is disposed below the semiconductor layer. A passivation layer 250 covering the organic light emitting diode 210 may be formed. The passivation layer 250 acts to protect the organic light emitting diode 210 from external physical and chemical stimulation, and may be formed of an organic layer, an inorganic layer, or a composite layer thereof.

Figure 3:
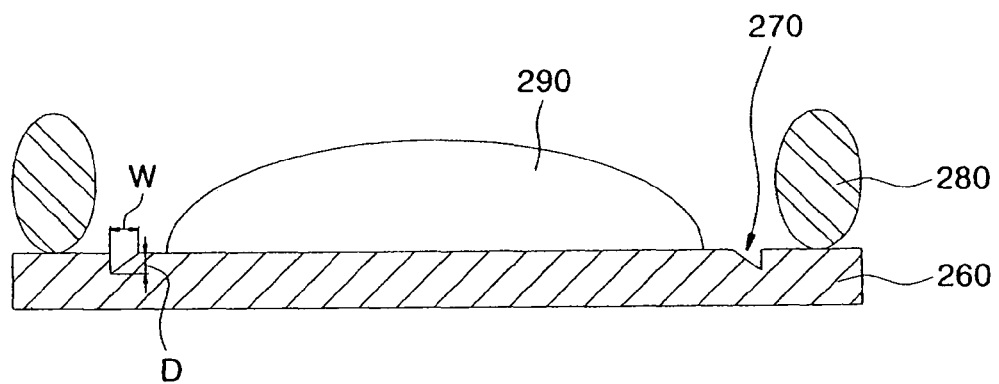

Referring to FIG. 3, an encapsulation substrate 260, which is equivalent to the top plate 1061, is provided. The encapsulation substrate 260 may be an insulating glass or plastic substrate. In some embodiments, a groove or recess 270 is formed in certain regions of the encapsulation substrate 260. For example, the groove or recess 270 is formed into the encapsulation substrate 260 such that the recess 270 forms a substantially closed loop surrounding the area immediately opposing the pixel region I of the substrate 200. The groove is preferably formed to completely surround the pixel region I although not limited thereto. Further, the recess 270 is formed internal to the areas on which the frit is to be formed.

In certain embodiments, the groove or recess 270 may be formed by etching, sand blasting, or molding, although not limited thereto. The recess 270 may be formed in various cross-sectional shapes. The cross-sectional shape of the recess 270 may be generally rectangular, square, triangular, etc. One or more edges forming the recess 270 may be linear or curvilinear. In certain embodiments, the recess 270 may include one or more surface that is sloped with reference to the interior surface of the substrate, into which the recess is formed.

In the illustrated embodiment, the recess 270 includes a first slope 272 and a second slope 274 with reference to the interior surface 262 of the encapsulation substrate 260. The first slope 272 is closer to the center of the interior surface of the encapsulation substrate 260 than the second slope 274. The second slope 274 is closer to the periphery of the encapsulation substrate 260 than the first slope 272. In the illustrated embodiment, the second slope 274 is steeper than the first slope 272 with reference to the interior surface. Thus, the sealant can smoothly flow over the first slope into the groove, but it is not easy for the sealant to flow beyond the second slope and be in contact with the glass frit. In some embodiments, the angle of the first slope 272 of the recess 270 with respect to the interior surface 262 of the encapsulation substrate 260 is about 0.1°, 0.2°, 0.3°, 0.4°, 0.5°, 0.7°, 1°, 2°, 3°, 4°, 5°, 6°, 7°, 8°, 9°, 10°, 12°, 15°, 20°, 25°, 30°, 35°, 40°, 45° or 50°. In certain embodiments, the angle of the second slope 274 of the recess 270 with respect to the interior surface 262 of the encapsulation substrate 260 is about 90°, 88°, 86°, 84°, 82°, 80°, 78°, 76°, 73°, 70°, 65°, 60°, 55°, 50° or 45°.

In an embodiment, the groove 270 preferably has a depth (d) of about 20 µm to about 300 µm, although not limited thereto. In certain embodiments, the groove or recess 270 has a depth of about 10, 20, 30, 40, 50, 70, 100, 150, 200, 250, 300, 350, 400, 450, 550, 600, 700, 800, 900 or 1000 µm. In an embodiment, the groove 270 preferably has a width (w) of about 0.1 mm to about 5 mm, although not limited thereto. In certain embodiments, the groove or recess 270 has a width of about 0.1, 0.2, 0.3, 0.4, 0.5, 0.7, 1, 1.5, 2, 3, 4, 5, 6, 7, 8, 9 or 10 mm.

A glass frit 280 is formed along the periphery of the groove 270 of the encapsulation substrate 260. In certain embodiments, the glass frit 280 may be formed of one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a combination thereof. In an embodiment, the glass frit 280 may be formed by a screen printing method or a dispensing method. In this case, a height of the glass frit is preferably about 10 μm to about 300 μm.

A sealant 290 is formed within a region surrounded by the groove 270 of the encapsulation substrate 260 to form a film between the encapsulation substrate 260 and the array of organic light emitting pixels. The sealant 290 is disposed on an area corresponding to the pixel region I of the substrate 200. In some embodiments, an UV curable material or a thermosetting material may be used as the sealant 290. For example, acrylic-based resin or polyimide-based resin may be employed, and urethane acryl is preferably employed.

In embodiments, the sealant 290 is substantially transparent. Accordingly, light emitted from the organic light emitting diode 210 can be emitted outward through the encapsulation substrate 260. That is, a top-emitting organic light emitting display device can be implemented, although not limited thereto. In other embodiments, the organic light emitting display device may be a bottom-emitting type and light is emitted through the substrate 200. In alternative embodiment, the organic light emitting display device may be a dual-emitting type and light is emitted through both of the substrate 200 and the encapsulation substrate 260.

Figure 4:
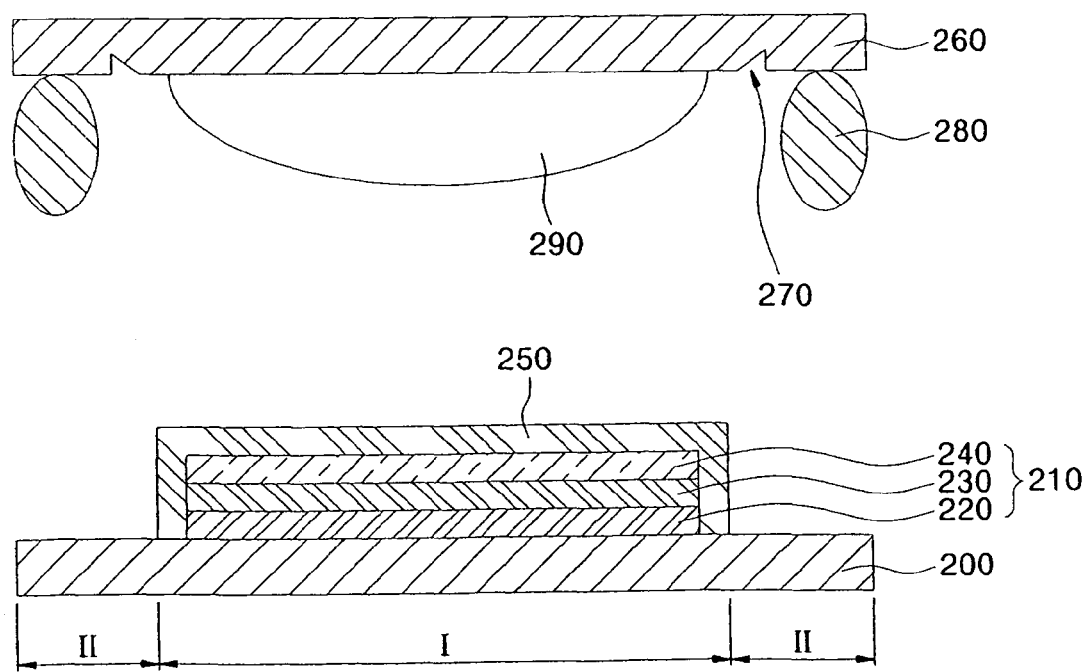
Figure 5:
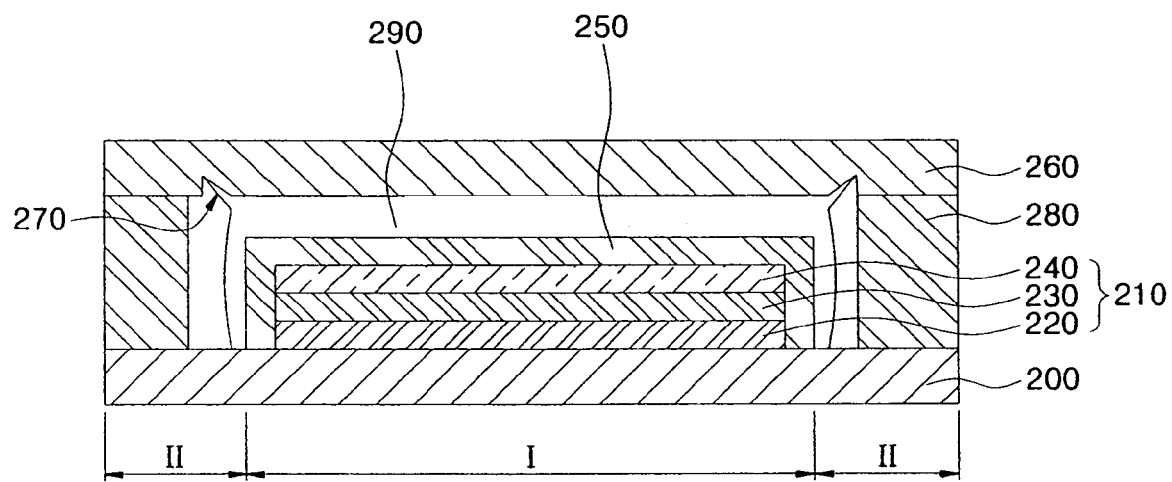

Referring to FIG. 4, the encapsulation substrate 260, on which the glass frit 280 and the sealant 290 are formed, is disposed such that the glass frit 280 and the sealant 290 face the substrate 200. Pressure is applied to the substrate 200 and the encapsulation substrate 260 to seal the substrate 200 to the encapsulation substrate 260 as shown in FIG. 5. And then, the sealant 290 covers the organic light emitting diode 210 formed on the substrate 200. In an embodiment, a portion of the sealant 290 may flow toward the outside of the pixel region I when the pressure is applied. However, the portion of the sealant becomes in contact with the groove 270 and trapped therein. Accordingly, the sealant 290 is prevented from flowing to contact the glass frit 280. Thus, the glass frit 280 or film 290 can be prevented from being contaminated. In other words, the groove 270 can control the overflow of the sealant 290. Therefore, the glass frit 280 can be prevented from being contaminated, the glass frit can be prevented from being delaminated, and the sealant can avoid a damage which may be caused by high heat created when the laser is irradiated onto the glass frit.

After the arranging the substrate 200 and the encapsulation substrate 260, the laser is irradiated onto the glass frit 280 to melt and solidify the glass frit 280, and then the substrate 200 is attached to the encapsulation substrate 260. Heat is applied to or UV is irradiated onto the sealant 290 to cure the sealant 290. According to some embodiments of the present invention, the laser is irradiated onto the glass frit and then the UV is irradiated onto the sealant for curing. However, in other embodiments, the UV may be irradiated onto the sealant to cure the sealant, and then the laser may be irradiated onto the glass frit to melt and solidify the glass frit.

As a result, an organic light emitting display device according to exemplary embodiments of the present invention is fabricated. As described above, a groove is formed on the encapsulation substrate to substantially separate a sealant from a glass frit. Thus, the sealant can be prevented from being damaged by heat for melting the frit when the laser is irradiated onto the glass frit. The resultant adhesive strength of frit can be prevented from being deteriorated due to the delaminated glass frit.

Although the aspects and features of the present invention has been described with reference to certain exemplary embodiments thereof, it will be understood by those skilled in the art that a variety of modifications and variations may be made to the embodiments presented herein without departing from the spirit or scope defined in the appended claims, and their equivalents.

What is claimed is:

1. An organic light emitting display device, comprising:
a first substrate;
a second substrate comprising an interior surface opposing the first substrate;
an array of organic light emitting pixels formed between the first and second substrates, the array comprising a top surface facing the second substrate;
a frit seal interposed between the first and second substrates while surrounding the array; and
a film structure comprising one or more layered films, the film structure comprising a portion interposed between the array and the second substrate, the film structure contacting the interior surface and the top surface;
wherein the second substrate comprises a recess on interior surface.

2. The device of claim 1, wherein the interior surface is substantially planar and has a size substantially equal to or greater than that of the top surface.

3. The device of claim 1, wherein at least part of the film structure is formed within the recess.

4. The device of claim 1, wherein the film structure extends into the recess.

5. The device of claim 1, wherein the film structure further comprises another portion interposed between the first and second substrates while not interposed between the array and the second substrate.

6. The device of claim 1, wherein the film structure covers substantially the entire portion of the top surface.

7. The device of claim 1, wherein the film structure comprises a resin.

8. The device of claim 7, wherein the resin is of a UV curable type or a heat curable type.

9. The device of claim 7, wherein the resin comprises at least one selected from the group consisting of acrylic resins and polyimide resins.

10. The device of claim 9, wherein the resin comprises a urethane acrylic resin.

11. The device of claim 1, wherein at least part of the film structure is substantially transparent with respect to visible light.

12. The device of claim 1, wherein the array emits visible light through the second substrate.

13. The device of claim 1, wherein the recess extends along a segment of the frit seal.

14. The device of claim 13, wherein the recess is substantially parallel to the segment of the frit seal.

15. The device of claim 1, wherein the recess forms a closed loop.

16. The device of claim 1, wherein the interior surface is substantially planar, and the recess comprises a slope with reference to the interior surface such that the recess becomes deeper in a direction from the center of the interior surface toward periphery of the interior surface.

17. The device of claim 1, wherein the interior surface is substantially planar, and the recess comprises a first slope and a second slope with reference to the interior surface, which forms a valley, wherein the first slope is closer to the center than the second slope, wherein the second slope is steeper than the first slope with reference to the interior surface.

18. The device of claim 17, wherein the second slope is substantially perpendicular to the interior surface.

19. The device of claim 1, wherein the array comprises a first electrode, a second electrode and an organic light emitting material interposed between the first and second electrodes, wherein the first electrode has a first distance from the first substrate, and the second electrode has a second distance from the first substrate, wherein the second distance is greater than the first distance, and wherein the top surface is a surface of the first electrode.

20. The device of claim 1, wherein the film structure comprises an organic layer and a protective layer interposed between the array and the organic resin layer, wherein the layer is configured to substantially inhibit the organic resin layer from diffusing into the array.

21. The device of claim 1, wherein the recess has a depth measured from the interior surface, and wherein the depth is from about 20 μm to about 300 μm.

22. The device of claim 1, wherein the recess has a width measured on the interior surface in a direction parallel to an edge of the interior surface, and wherein the width is from about 0.1 mm to about 5 mm.

23. The device of claim 1, wherein the fit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

24. A method of making an organic light emitting device according to claim 1, the method comprising:
  providing the first substrate and the array of light emitting pixels formed on the first substrate with or without a layer therebetween;
  providing the second substrate and a curable resin formed over a surface of the second substrate;
  arranging the first and second substrates such that the resin is located between the array and the second substrate;
  interconnecting the first and second substrates with the frit seal such that the frit seal surrounds the array; and
  curing the curable resin to form the film structure such that the film structure comprises one or more layered films comprising the cured resin and contacts the second substrate and the array.

25. The method of claim 24, wherein at least part of the resin flows into the recess.

26. The method of claim 25, wherein the at least part of the resin stops to flow within the recess.

* * * * *